(12) United States Patent
Soelberg et al.

(10) Patent No.: US 8,529,356 B2
(45) Date of Patent: Sep. 10, 2013

(54) APPARATUS AND METHOD FOR ADAPTING AUDIO SIGNALS

(75) Inventors: Tino Soelberg, Copenhagen (DK); Lung-Jen Hsu, Taipei (CN); Francis Arnold Grever, Palatine, IL (US)

(73) Assignee: Steelseries ApS, Valby (DK)

( * ) Notice: Subject to any disclaimer, the term of this patent is extended or adjusted under 35 U.S.C. 154(b) by 224 days.

(21) Appl. No.: 12/869,699

(22) Filed: Aug. 26, 2010

(65) Prior Publication Data

US 2012/0052948 A1 Mar. 1, 2012

(51) Int. Cl.
*A63F 13/00* (2006.01)

(52) U.S. Cl.
USPC .................... 463/46; 463/42; 463/36; 463/40

(58) Field of Classification Search
USPC .................................. 463/42, 35, 36, 40, 39
See application file for complete search history.

(56) References Cited

U.S. PATENT DOCUMENTS

| | | | |
|---|---|---|---|
| 2005/0003892 A1* | 1/2005 | Cheng et al. | 463/35 |
| 2005/0159833 A1 | 7/2005 | Giaimo | |
| 2009/0175462 A1* | 7/2009 | Varma et al. | 381/71.1 |
| 2010/0040240 A1* | 2/2010 | Bonanno | 381/74 |

OTHER PUBLICATIONS

Turtle Beach, "Ear Force PX21—New PS3 Headset", pp. 1-2; http://www.turtlebeach.com/products/ps3-gaming-headsets/ear-force-px21.aspx, website last visited Jul. 14, 2010.
Steelseries, "Spectrum 5XB", pp. 1-2; http://www.steelseries.com/us/press/press_releases/steelseries_introduces_new_audio_pro . . . , website last visited Jul. 19, 2010.
Turtle Beach, "Frequently Asked Questions Ear Force PX21", pp. 1-4; http://www.turtlebeach.com/products/ps3-gaming-headsets/ear-force-px21.aspx, website last visited Jul. 14, 2010.
Yamaha, "AW1600 Professional Audio Workstation", 2005.

* cited by examiner

*Primary Examiner* — Arthur O. Hall
*Assistant Examiner* — Jeffrey Wong
(74) *Attorney, Agent, or Firm* — Guntin & Gust, PLC; Ralph Trementozzi

(57) ABSTRACT

A system that incorporates teachings of the present disclosure may include, for example, an audio control apparatus having a game audio port for receiving a gaming audio signal generated by a gaming application, a chat port for receiving a chat signal comprising audio information generated by at least one gamer, and an audio system coupled to the game audio port and the chat port. The audio system can be operable to detect an energy level in the chat signal that exceeds a threshold, reduce a magnitude of the gaming audio signal to a desired audio energy level responsive to the aforementioned detection, generate a mixed audio signal comprising a combination of the gaming audio signal having the reduced magnitude and the chat signal, and transmit the mixed audio signal to a listening apparatus. Additional embodiments are disclosed.

20 Claims, 5 Drawing Sheets

100

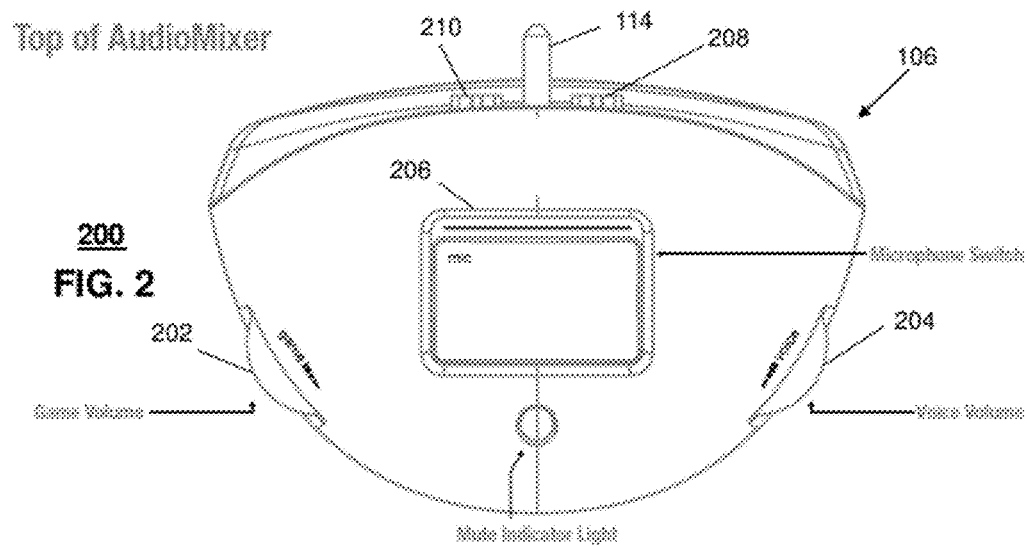
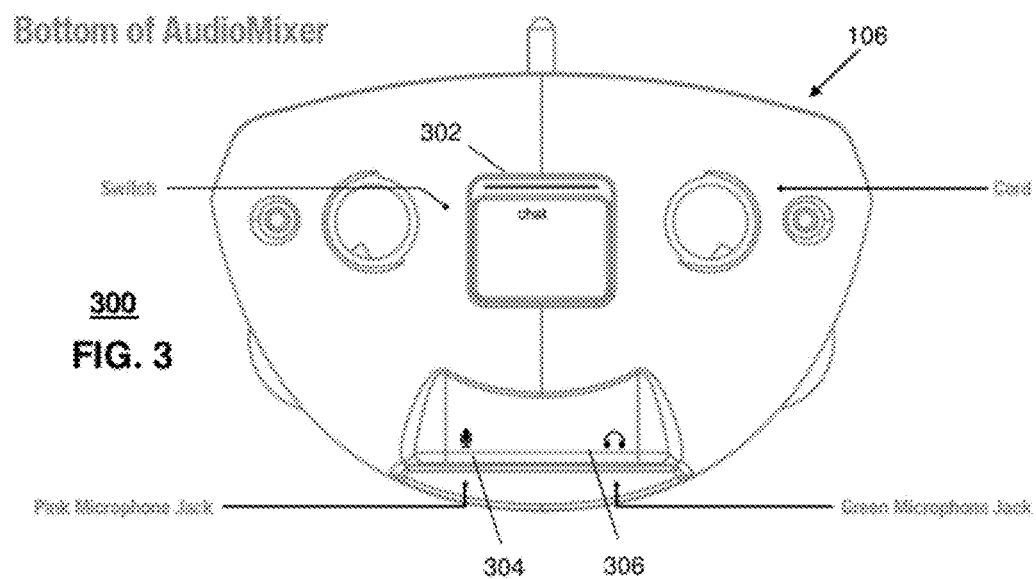

400

500

US 8,529,356 B2

APPARATUS AND METHOD FOR ADAPTING AUDIO SIGNALS

FIELD OF THE DISCLOSURE

The present disclosure relates generally to audio adaptation techniques, and more specifically to an apparatus and method for adapting audio signals.

BACKGROUND

Multiplayer video games today are capable of supporting team discussions over an Internet connection with players scattered in remote locations. Generally, the sound of the video game at each player's location can be loud and can at times make it difficult for players to hear each other.

BRIEF DESCRIPTION OF THE DRAWINGS

FIGS. 2-3 depict illustrative embodiments of an audio control apparatus operating in the video game system of FIG. 1.

DETAILED DESCRIPTION

One embodiment of the present disclosure can entail an audio control apparatus having a game audio port for receiving a gaming audio signal generated by a gaming application, a chat port for receiving a chat signal comprising audio information generated by at least one gamer, and an audio system coupled to the game audio port and the chat port. The audio system can be operable to detect an energy level in the chat signal that exceeds a threshold, reduce a magnitude of the gaming audio signal to a desired audio energy level responsive to the aforementioned detection, generate a mixed audio signal comprising a combination of the gaming audio signal having the reduced magnitude and the chat signal, and transmit the mixed audio signal to a listening apparatus.

One embodiment of the present disclosure can entail a non-transitory computer-readable storage medium operating in an audio control apparatus communicatively coupled to a gaming console that generates a chat signal and a gaming audio signal having computer instructions to detect an energy level in the chat signal, reduce a magnitude of the gaming audio signal to a desired audio energy level responsive to the aforementioned detection, generate a mixed audio signal comprising a combination of the gaming audio signal having the reduced magnitude and the chat signal, and transmit the mixed audio signal to a listening apparatus communicatively coupled to the audio control apparatus.

One embodiment of the present disclosure can entail a method for detecting an energy level in a chat signal generated by a gaming console, reducing a magnitude of a gaming audio signal to a desired audio energy level responsive to the aforementioned detection, wherein the gaming audio signal is generated by the gaming console, generating a mixed audio signal comprising a combination of the gaming audio signal having the reduced magnitude and the chat signal, and transmitting the mixed audio signal to a listening apparatus.

Figure 1:
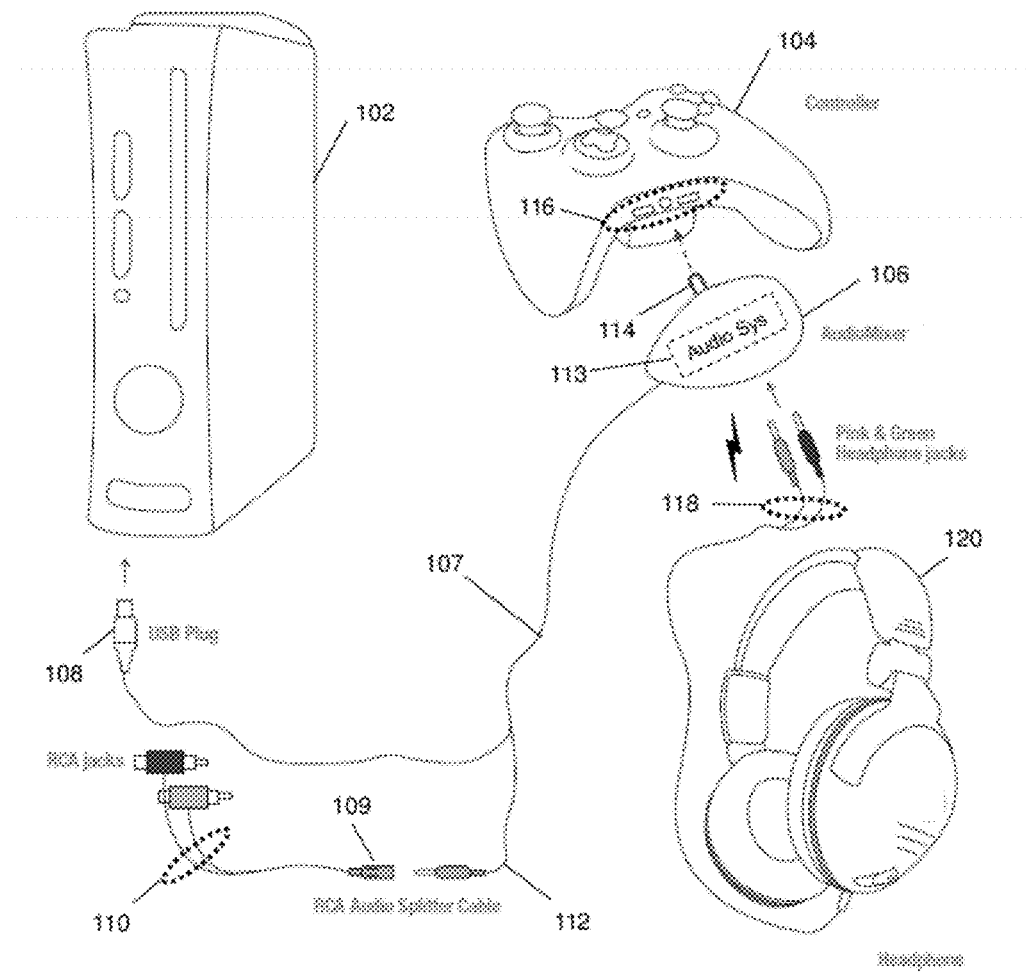
FIG. 1 depicts an illustrative embodiment of a video game system.

FIG. 1 depicts an illustrative embodiment of a video game system 100. FIG. 1 can comprise a gaming console 102 such as an Xbox 360™, PS3™, Wii™ or another video gaming device such as a computer communicatively coupled to a gaming server over the Internet for playing online gaming (e.g., World of Warcraft™). The gaming console 102 can be communicatively coupled to a gaming controller 104 over a wired or wireless interface such as WiFi, Bluetooth, or other wireless protocols which may be proprietary. The housing assembly of the gaming controller 104 can be coupled to a housing assembly of an audio control apparatus 106 with a mechanical guide 114 which can be inserted into a receptor panel 116 of the gaming controller 104. The receptor panel 116 can comprise a hole for engaging with the guide 114, and two electromechanical ports which supply a chat signal to a chat port (see references 208, 210 of FIG. 2) of the audio control apparatus 106. The gaming controller 104 can receive the chat signal from the gaming console 102. The gaming console 102 can be communicatively coupled to a server over an Internet connection for receiving audio information generated by remote players which can be used to form the chat signal transmitted to the gaming controller 104 over a tethered or wireless interface.

The audio control apparatus 106 can comprise a cable 107 tethered thereto. The cable 107 can have one branch in the form of a USB plug 108, and another branch in the form of a game audio port 112. The USB plug 108 can be engaged with a USB port of the gaming console 102. Once engaged, the gaming console 102 can feed a power signal over cable 107 to the audio control apparatus 106. The game audio port 112 can be coupled to an RCA audio connector 109 which branches out to first and second RCA jacks 110. The RCA jacks 110 can be coupled to any audio port that generates a gaming audio signal (e.g., audio port of a TV receiving gaming audio signals from the gaming console 102, or an audio port of an amplifier receiving gaming audio signals from the gaming console 102, etc.). Once the RCA jacks 110 are engaged with an audio port supplying the gaming audio signal, said gaming audio signal is in turn supplied to the audio control apparatus 106 by way of the cable 107.

A headset 120 can also be coupled to an audio port (see references 304, 306 of FIG. 3) of the audio control apparatus 106 by way of a tethered interface 118. Alternatively, the audio control apparatus 106 can be adapted to communicatively coupled to the headset 120 over a wireless interface operating according to a wireless protocol such as Bluethooth™, WiFi, or other present or next generation wireless protocols suitable to the present disclosure. The headset 120 can receive a mixed audio signal from the audio port over the tethered interface 118 or a wireless interface. In addition, the headset 120 can supply to the audio port of the audio control apparatus 106 a microphone signal generated by a microphone integrated in the headset 120. The microphone signal can in turn be transmitted by the audio control apparatus 106 to other remote players by way of the gaming controller 104 when the gaming console 102 is executing a multi-player gaming application with one or more remote players over the Internet.

It will be appreciated that all or portions of the tethering aspects of FIG. 1 (e.g., reference 107, 118, etc.) can be wireless instead. The headset 120, the audio control apparatus 106, and the gaming controller 104, for example, can be communicatively coupled to each other and other devices by utilizing in each of these device an RF receiver, transmitter or combination thereof (transceiver) that supports a wireless interface using common protocols (e.g., Bluetooth or WiFi). Accordingly, wireless embodiments of FIG. 1 are contemplated by the present disclosure.

FIGS. 2-3 depict additional illustrative embodiments of the audio control apparatus 106. FIG. 2 depicts a top side of the audio control apparatus 106. The audio control apparatus 106 can comprise a first slidable switch 206 for enabling or disabling transmission of microphone signals generated by the headset 120 to the gaming console 102. The audio control apparatus 106 can comprise a first thumbwheel 202 for adjusting the volume (signal magnitude) of the gaming audio signals received by way of the RCA jacks 110 of the cable 107. Similarly, the audio control apparatus 106 can comprise a second thumbwheel 204 for adjusting the volume (signal magnitude) of the chat signal supplied by the gaming controller 104. FIG. 3 depicts a bottom side of the audio control apparatus 106. The audio control apparatus 106 can have a second slidable switch 302 for enabling or disabling the transmission of the chat signal to the headset 120.

Figure 4:
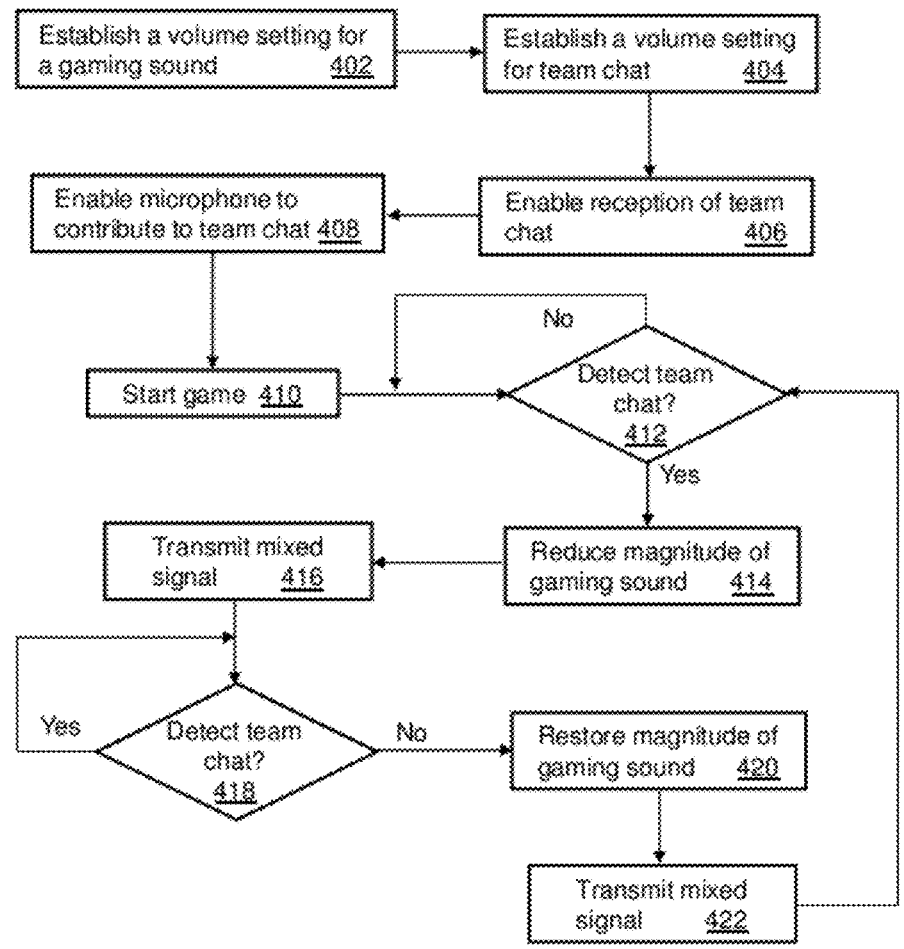
FIG. 4 depicts an illustrative method operating in the audio control apparatus of FIGS. 1-3.

The audio control apparatus 106 can comprise an audio system 113 located within a housing assembly of the audio control apparatus 106 as shown in FIG. 1. The audio system 113 can comprise a controller such as a microprocessor, a state-machine, an application specific integrated circuit (ASIC), or other controlling device. The audio system 113 can also comprise other devices for sampling audio signals such as one or more analog-to-digital converter (ADCs). The audio system can further comprise one or more digital-to-analog converters (DACs). In addition amplifier circuits and/or filters may be used to adapt audio signals according to the present disclosure. The audio system 113 can be adapted to control audio signals as depicted in the method 400 of FIG. 4.

Method 400 can begin with step 402 in which the audio system 113 is adapted to establish a volume setting for the gaming sound received by the audio control apparatus 106 over the cable 107. A user can move the first thumbwheel 202 of FIG. 2 in a clockwise or counterclockwise direction to establish a desirable volume setting for the gaming sound. Once the user has picked a setting, the audio system 113 can in turn adjust the magnitude of the gaming signal received over the cable utilizing digital or analog signal processing techniques.

At step 404, the audio system 113 can be operable to establish a volume setting for team chat. Team chat represents team player voices which are received from the gaming controller 104 in the form of the chat signal previously discussed. The chat signal can comprise the voice of one or more remote players which are engaged in a multi-player gaming application with the gamer wearing the headset 120. The team chat volume can be adjusted by the second slidable thumbwheel 204 which can also be turned by a user in a clockwise or counterclockwise direction to a desirable volume setting. Once the user has completed the adjustment, the audio system 113 can be operable to adjust a magnitude of the chat signal to the desired audio level selected by the user of the headset 120.

Figure 5:
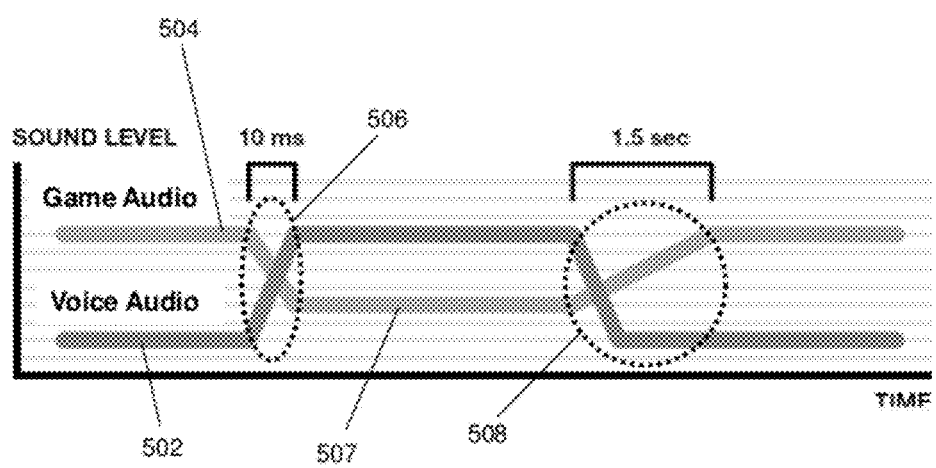
FIG. 5 depicts an illustrative embodiment of a timing diagram of audio signals controlled by the audio control apparatus shown in FIGS. 1-3 according to the method of FIG. 4.

Reception of team chat can be enabled at step 406 with the slidable switch 302. Similarly, the microphone signal generated by the user of the headset 120 can be enabled with slidable switch 206 at step 408. At step 410 a multi-player gaming application (e.g., Call of Duty™) can be initiated. At step 412, the audio system 113 can be adapted to monitor the chat signal 502 (shown in FIG. 5) to detect a transition of energy 506 that the audio system 113. Upon detecting a transition 506, the audio system 113 can determine the energy level of the chat signal exceeds a threshold (e.g., XXX dB) established by the designer of the audio system 113). The change in signal energy can be caused by one or more players engaging in team chat. To enhance the hearing perceptibility of the player wearing headset 120, the audio system 113 can be operable to reduce a magnitude of the gaming audio signal 504 (see FIG. 5) established in step 402, while maintaining unchanged the volume setting of chat signal 502 established in step 404. The magnitude of the gaming audio signal 504 can be reduced according to a signal profile established by the designer of the audio system 113.

To provide the player wearing the headset 120 a tactical advantage, the magnitude of the gaming audio signal 504 can be reduced rapidly (e.g., 10 milliseconds or ms) once the chat signal 502 is detected to exceed the threshold. It should be noted that the new magnitude 507 of the gaming audio signal 504 need not be at a level that is not audible by the player of the headset 120. It may be desirable for the player wearing the headset 120 to hear at least some background gaming sound of the gaming application. Once the gaming audio signal 504 has been adapted, the audio system 113 can mix the chat signal 502 with the gaming audio signal 504 having the reduced magnitude 507, and transmit it to the headset 120 over a tethered or wireless interface as shown in FIG. 1.

The audio system 113 can be adapted in step 418 to monitor the chat signal 503. If it falls below the threshold mentioned above, it can indicate the players teamed with the player wearing the headset 120 have ceased to speak. In step 420, the audio system 113 can be adapted to restore the magnitude of the gaming audio signal 504 as established in step 402. Since team chat is unpredictable and can occur frequently, the audio system 113 can be adapted to restore the magnitude of the gaming audio signal 504 at a slower rate than the rate used to reduce it in step 414 (e.g., 1.5 seconds v. 10 milliseconds). The slower rate of restoration can be useful to the player wearing the headset 120 to avoid oscillations in the volume of gaming sound due to frequent on and off team conversations. During the restoration process, the audio system 113 mixes the chat signal 502 with the gaming audio signal 504 as it is being restored and transmits it to the headset 120 in step 422.

From the foregoing descriptions, it would be evident to an artisan with ordinary skill in the art that the aforementioned embodiments can be modified, reduced, or enhanced without departing from the scope and spirit of the claims described below. For example, in one embodiment the audio control apparatus 106 can be adapted so that the player wearing the headset 120 can also be allowed to define in the signal profile the rate of reduction and restoration the gaming audio signal 504 at slopes 506 and 508 shown in FIG. 5. In addition, the audio control apparatus 106 can be adapted so that the player wearing the headset 120 can be allowed to define the degree of reduction in magnitude 507. The player can be presented additional controls in the audio control apparatus 106 to perform these changes.

In one embodiment, the audio control apparatus 106 can in whole or in part be integrated into the housing assembly of the gaming controller 104. For example, volume controls 202 and 204 (e.g., thumbwheels) can be located on suitable portions of the gaming controller 104 (e.g., side edges) so that each volume control mechanism is easily accessible to the user. The first slidable switch 206 for enabling or disabling transmission of microphone signals generated by the headset 120 to the gaming console 102 can be located on the bottom side of the housing assembly of the gaming controller 104 or another suitable location readily accessible to the user. The second slidable switch 302 for enabling or disabling the transmission of the chat signal to the headset 120 can also be located on the bottom portion of the housing assembly of the gaming controller 104. The gaming controller 104 can be adapted with audio ports to couple with the tethered interface 118 of the headset 120. By integrating the audio control apparatus 106 in the gaming controller 104 fewer devices would be required thereby reducing peripheral complexity.

In another embodiment, the audio control apparatus 106 can in whole or in part be integrated into the housing assembly of the headset 120 in a manner similar to what has been described above for the gaming controller 104. In yet another embodiment, the audio control apparatus 106 can be in whole or in part integrated into the gaming console 102. In this embodiment, volume controls 202 and 204 can be located at the gaming controller 104 or the headset 120, while the audio control function depicted in FIG. 5 can be located in the gaming console 102. Adjustments to the volume controls in either the headset 120 or the gaming controller 104 can be communicated to the gaming console 102 over a wired or wireless medium.

From the above illustrations, it is contemplated that the components and functions of the audio control apparatus 106 can be centralized, distributed, integrated, and/or communicatively coupled to any device utilized in establishing a gaming environment which involves gaming audio and team chat.

These and other suitable modifications can be applied to the present disclosure. Accordingly, the reader is directed to the claims for a fuller understanding of the breadth and scope of the present disclosure.

Figure 6:
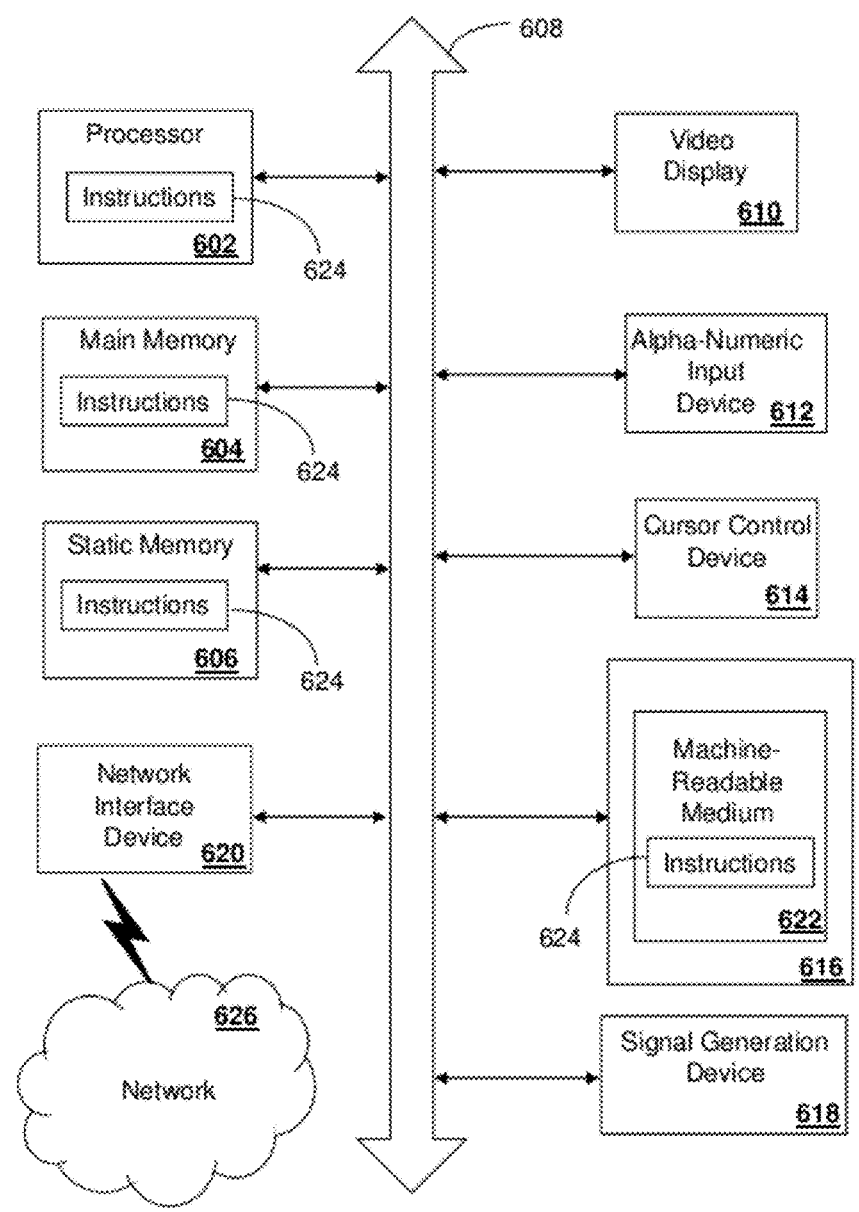
FIG. 6 depicts an illustrative diagrammatic representation of a machine in the form of a computer system within which a set of instructions, when executed, may cause the machine to perform any one or more of the methodologies disclosed herein.

FIG. 6 depicts an exemplary diagrammatic representation of a machine in the form of a computer system 600 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 600 may include a processor 602 (e.g., a central processing unit (CPU), a graphics processing unit (GPU, or both), a main memory 604 and a static memory 606, which communicate with each other via a bus 608. The computer system 600 may further include a video display unit 610 (e.g., a liquid crystal display (LCD), a flat panel, a solid state display, or a cathode ray tube (CRT)). The computer system 600 may include an input device 612 (e.g., a keyboard), a cursor control device 614 (e.g., a mouse), a disk drive unit 616, a signal generation device 618 (e.g., a speaker or remote control) and a network interface device 620.

The disk drive unit 616 may include a machine-readable medium 622 on which is stored one or more sets of instructions (e.g., software 624) embodying any one or more of the methodologies or functions described herein, including those methods illustrated above. The instructions 624 may also reside, completely or at least partially, within the main memory 604, the static memory 606, and/or within the processor 602 during execution thereof by the computer system 600. The main memory 604 and the processor 602 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 624, or that which receives and executes instructions 624 from a propagated signal so that a device connected to a network environment 626 can send or receive voice, video or data, and to communicate over the network 626 using the instructions 624. The instructions 624 may further be transmitted or received over a network 626 via the network interface device 620.

While the machine-readable medium 622 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and carrier wave signals such as a signal embodying computer instructions in a transmission medium; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An audio control apparatus, comprising:
a game audio port to receive from a gaming console of a first gamer, a gaming audio signal generated by a gaming application;
a chat port to receive from a gaming controller of the first gamer, a team chat signal comprising audio information generated by a microphone of a remote gamer;
a first audio interface to provide a mixed audio signal to a listening apparatus of the first gamer, and a second audio interface to receive a microphone signal from a microphone of the first gamer; and
an audio system coupled to the game audio port and the chat port, wherein the audio system performs operations comprising:
detecting an energy level in the team chat signal that exceeds a threshold;
reducing a magnitude of the gaming audio signal at the game audio port from a first audio energy level to a reduced audio energy level responsive to the detecting of the energy level in the team chat signal that exceeds the threshold;
generating the mixed audio signal comprising a combination of the gaming audio signal having the reduced energy level and the team chat signal; and
transmitting the mixed audio signal to the listening apparatus of the first gamer.

2. The audio control apparatus of claim 1, wherein the reducing of the magnitude of the gaming audio signal enhances, at the listening apparatus of the first gamer, a perceptibility of the audio information generated by the microphone of the remote gamer.

3. The audio control apparatus of claim 1, wherein the audio system performs operations comprising reducing the magnitude of the gaming audio signal at a predetermined rate.

4. The audio control apparatus of claim 1, wherein the audio system performs operations comprising:
detecting that the energy level in the team chat signal has fallen below the threshold;
restoring the magnitude of the gaming audio signal to the first audio energy level responsive to the detecting that the energy level in the team chat signal has fallen below the threshold;
generating a second mixed audio signal comprising a combination of the gaming audio signal having the first audio energy level and the team chat signal; and
transmitting the second mixed audio signal to the listening apparatus of the first gamer.

5. The audio control apparatus of claim 4, wherein the magnitude of the gaming audio signal is reduced from the first audio energy level to the reduced audio energy level at a first rate, wherein the magnitude of the gaming audio signal is restored from the reduced audio energy level to the first audio energy level at a second rate, and wherein a magnitude of the first rate exceeds a magnitude of the second rate.

6. The audio control apparatus of claim 1, wherein the audio system performs operations comprising:
detecting a volume setting for the gaming audio signal; and
adapting the gaming audio signal according to the volume setting.

7. The audio control apparatus of claim 1, wherein the audio system performs operations comprising:
detecting a volume setting for the team chat signal; and
adjusting the energy level in the team chat signal according to the volume setting.

8. The audio control apparatus of claim 1, wherein the audio system performs operations comprising:
detecting a signal profile for the gaming audio signal; and
adjusting changes in the magnitude of the gaming audio signal according to the signal profile.

9. The audio control apparatus of claim 8, wherein the audio system performs operations comprising receiving an adjustment to the signal profile from a user interface of the audio control apparatus.

10. The audio control apparatus of claim 1, comprising:
a switch that enables or disables a transmission of a microphone signal originating at the microphone of the first gamer to the gaming application.

11. The audio control apparatus of claim 1, comprising a switch that enables or disables a reception of the team chat signal, wherein the audio control apparatus is communicatively coupled to the gaming controller that supplies the team chat signal, and wherein the gaming controller is communicatively coupled to a gaming console.

12. The audio control apparatus of claim 1, wherein the listening apparatus of the first gamer is communicatively coupled to the audio control apparatus by a tethered interface or a wireless interface, and wherein the microphone of the first gamer is communicatively coupled to the audio control apparatus by a tethered interface or a wireless interface.

13. The audio control apparatus of claim 1, wherein the audio control apparatus is an integral part of the listening apparatus of the first gamer.

14. The audio control apparatus of claim 1, wherein the audio control apparatus is coupled to a gaming console, and wherein gaming console supplies a power signal to the audio control apparatus to enable operations thereof.

15. The audio control apparatus of claim 1, wherein the listening apparatus of the first gamer comprises a headset comprising a speaker, and wherein the gaming application operates from a gaming console or a remote server.

16. A non-transitory computer-readable storage medium, comprising computer instructions, which when executed by a processor, causes the processor to perform operations comprising:
receiving at a game audio port a gaming audio signal from a gaming console of a first gamer, wherein the gaming audio signal is generated by a gaming application executed by the gaming console;
detecting at a chat port an energy level in a team chat signal obtained from a gaming controller of the first gamer, wherein the team chat signal comprises audio information generated by a microphone of a remote gamer;
receiving at a first audio interface, a microphone signal from a microphone of the first gamer;
reducing a magnitude of the gaming audio signal at the game audio port from a first audio energy level to a reduced audio energy level responsive to the detecting of the energy level in the team chat signal;
generating a mixed audio signal comprising a combination of the gaming audio signal having the reduced audio energy level and the team chat signal; and
transmitting from a second audio interface the mixed audio signal to a listening apparatus of the first gamer.

17. The non-transitory computer-readable storage medium of claim 16, wherein the processor further performs operations comprising:
detecting that the energy level in the team chat signal has fallen below a threshold;
restoring the magnitude of the gaming audio signal to the first audio energy level responsive to the detecting that the energy level in the team chat signal has fallen below the threshold;
generating a second mixed audio signal comprising a combination of the gaming audio signal having the first audio energy level and the team chat signal; and
transmitting the second mixed audio signal to the listening apparatus of the first gamer.

18. The non-transitory computer-readable storage medium of claim 16, wherein the processor further performs operations comprising:
detecting a signal profile for the gaming audio signal; and
adjusting changes in the magnitude of the gaming audio signal according to the signal profile.

19. A method, comprising:
detecting, by an audio control apparatus, an energy level in a team chat signal received from a gaming controller of a first gamer by way of a chat port, wherein the team chat signal comprises audio information generated by a microphone of a remote gamer, the audio control apparatus also receiving a gaming audio signal from a gaming console of the first gamer;
reducing, by the audio control apparatus, a magnitude of the gaming audio signal from a first audio energy level to a reduced audio energy level responsive to the detecting of the energy level in the team chat signal, wherein the gaming audio signal is generated by the gaming console;
receiving a microphone signal from a microphone of the first gamer by way of a first audio interface;
generating, by the audio control apparatus, a mixed audio signal comprising a combination of the gaming audio signal having the reduced audio energy level and the team chat signal, wherein the mixed audio signal is available to a listening apparatus of the first gamer by way of a second audio interface; and
transmitting, by the audio control apparatus, the mixed audio signal to the listening apparatus of the first gamer.

20. The method of claim 19, comprising:
detecting, by the audio control apparatus, a signal profile for the gaming audio signal; and
adjusting, by the audio control apparatus, changes in the magnitude of the gaming audio signal according to the signal profile.

* * * * *